July 2, 1963 K. K. N. CHANG 3,096,485
DIODE TRAVELING WAVE PARAMETRIC AMPLIFIER
Filed Jan. 4, 1960 3 Sheets-Sheet 1

INVENTOR.
Kern K.N. Chang
BY Joseph D. Black
ATTORNEY

INVENTOR.
Kern K.N. Chang
BY Joseph D. Black
ATTORNEY

DIODE TRAVELING WAVE PARAMETRIC AMPLIFIER

Filed Jan. 4, 1960 3 Sheets-Sheet 3

INVENTOR.
Kern K.N. Chang
BY Joseph D. Black
ATTORNEY

United States Patent Office 3,096,485

Patented July 2, 1963

3,096,485
DIODE TRAVELING WAVE PARAMETRIC AMPLIFIER

Kern K. N. Chang, Princeton, N.J., assignor to Radio Corporation of America, a corporation of Delaware Filed Jan. 4, 1960, Ser. No. 142
12 Claims. (Cl. 330—4.6)

The invention relates to traveling wave parametric amplifiers.

It is an object of the invention to provide an improved traveling wave parametric amplifier.

A further object is to provide a novel slow-wave, traveling wave parametric amplifier characterized by low-noise and broad band operation.

Another object is to provide a novel traveling wave parametric amplifier exhibiting a large degree of electrical separation between the respective sources of pump and signal energy such that a reduced loss of signal energy to the pump source and of pump energy to the signal source occurs.

Still another object is to provide a novel traveling wave parametric amplifier permitting a simple arrangement for applying pump energy to the amplifier so as to maintain the amplitude of the pump energy substantially constant along the amplifier.

Still another object is to provide a novel traveling wave parametric amplifier using a non-dispersive, helical transmission line in association with distributed non-linear, variable capacitance junction diodes to obtain high gain, low noise operation.

The objects of the invention are accomplished in one embodiment by applying signal energy to be amplified to one end of a slow-wave transmission line such as a helix or helical transmission line. The turns of the helix are loaded with one or more semiconductor junction diodes. The diodes are of the type exhibiting an operating region of non-linear capacitance in response to an applied voltage or electric field. The diodes are all mounted on the turns of the helix so that the direction of the diodes is uniformly made either transverse or longitudinal to the helix axis, according to whether the radial or axial radio frequency field of the helix is used. The direction of the diode for the purposes of this application is the diode axis along which current flow occurs.

Pump energy is applied to the helix by means of an inductive coupling located at the signal input end of the helix. The pump and signal energy interact along the helix across the diodes, the diodes functioning as non-linear capacitances. The resulting non-linear interaction of the pump and signal energy across the non-linear capacitances produces a negative conductive per unit length, the negative conductance forming the shunt conductance of the helical line per unit length. An amplification of the signal energy occurs as the signal energy and pump energy travel along the helix and past the diodes. An output circuit selective to the signal energy is coupled to the other end of the helix for deriving the amplified signal energy.

In a further embodiment, three helical transmission lines are provided. The three helical lines are arranged so as to have their turns loaded by the same non-linear, variable capacitance junction diodes. One helix supports the signal energy, a second supports the pump energy, and the third helix supports the idler energy having a frequency equal to the pump frequency minus the signal frequency and resulting from the interaction of the pump and signal energy. Again, amplification of the signal energy takes place by the non-linear interaction of the pump and signal energy across the diodes, and the amplified signal energy is obtained by a suitable connection to the output end of the helix supporting the signal energy.

The invention provides a traveling wave parametric amplifier having definite advantages. Because the wave path is helical, a greater number of wavelengths exist at a moment in time in a given length of the line than exist in the same length of a conventional, straight line type of traveling wave parametric amplifier. By using a helical line rather than a straight line, it is possible to achieve a higher level of amplification in the given length of line than can be achieved using the straight line approach. This is true since there are more wavelengths of the signal energy in the given length of the line to be acted upon. A considerable reduction in the total length of the line for a given level of amplification results. Because the amplifier is a slow-wave device, it is broad band and the problems of radiation such as loss of power encountered in the use of the faster wave devices are avoided.

The use of the helical line permits an effective isolation of the sources of pump and signal energy, since separate input paths for the pump and signal energy are used. The loss of energy to the respective sources is reduced to a minimum. Further, the use of the helical line facilitates the input of pump energy at different points along the line in order to maintain the amplitude of the pump energy substantially constant as it travels along the line, since only a simple inductive coupling is needed. The complex and bulky equipment previously employed to perform this function is eliminated. A high gain, low noise traveling wave parametric amplifier having all of the above advantages, as well as others which will become evident, is provided.

A more detailed description of the invention will now be given in connection with the accompanying drawing, wherein.

Figures 1, 2, 3, 4:
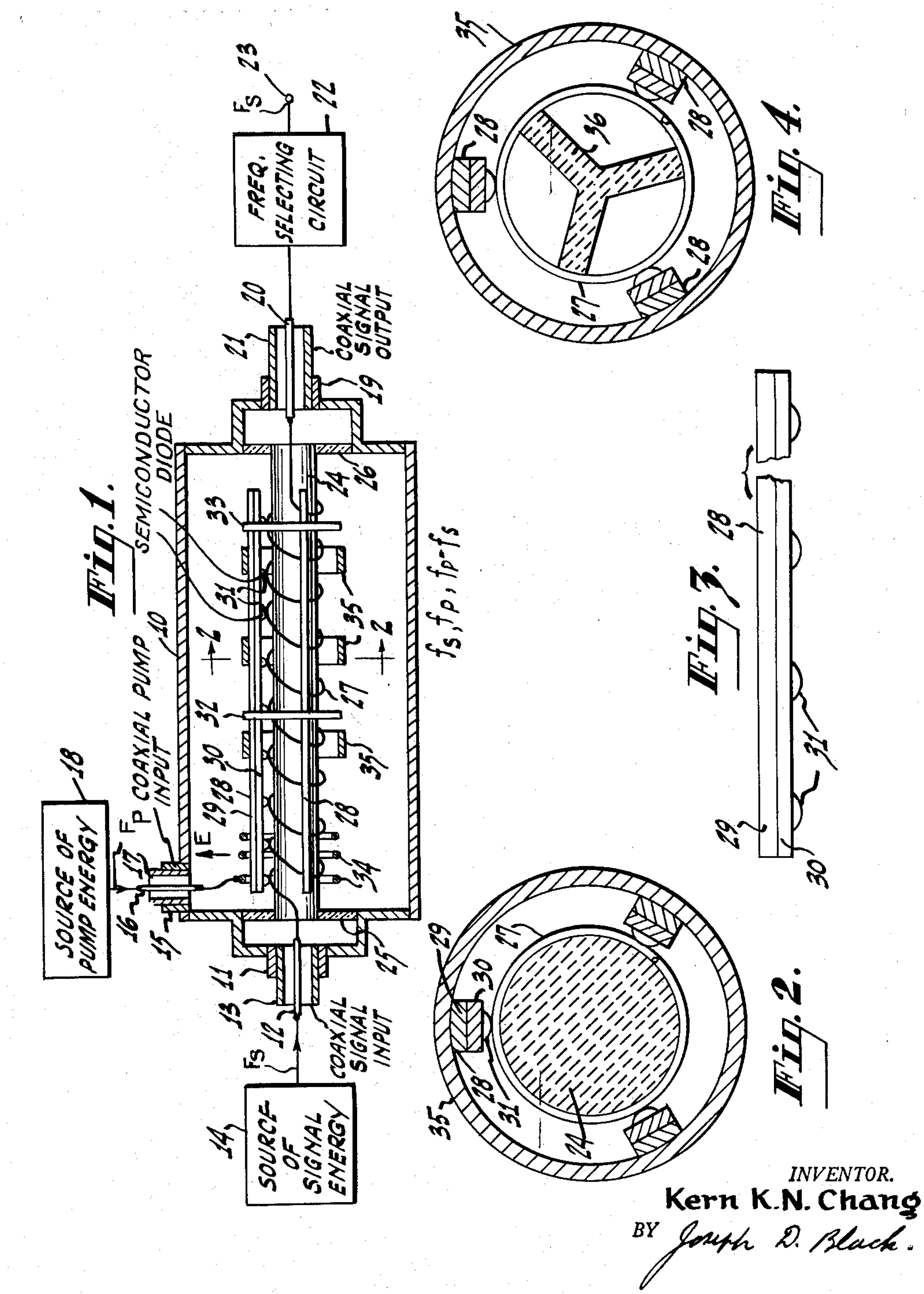
FIG. 1 is a schematic diagram of one embodiment partially in section of a traveling wave parametric amplifier constructed according to the invention.
FIG. 2 is an enlarged transverse cross-sectional view of the helix and semiconductor diode strips shown in FIG. 1.
FIG. 3 shows in enlarged detail the construction of a semiconductor diode strip as shown in FIG. 1.
FIG. 4 is a view in transverse cross-section of an alternative manner in which the helix and semiconductor diode strips shown in FIG. 1 may be arranged in an amplifier constructed according to the invention.

In the embodiment of FIGS. 1 and 2, a housing 10 is provided. The housing 10 is longer than it is wide and may be rectangular, cylindrical or any other shape according to the requirements of the surroundings in which the invention is used. The housing 10 is constructed of brass or any other suitable metallic material, and functions as an electrical shield and protective covering for the structure to be described. A standard coaxial connection 11 is located at the input end of the housing 10. A coaxial cable having an inner conductor 12 and an outer conductor 13 is connected at one end to the housing 10 via the connection 11 and at the other end to a source of signal energy 14 which is to be amplified.

A standard coaxial connection 15 similar to the connection 11 is located on the side area adjacent to the input end of the housing 10. A coaxial cable having an inner conductor 16 and an outer conductor 17 is connected at one end to the housing 10 via the connection 15 and at the other end to a source of pump energy 18. In addition to the two connections 11 and 15, a third coaxial connection 19 is located at the ouput end of the housing 10. A coaxial cable having an inner conductor 20 and an outer conductor 21 is connected at one end to the housing 10 via connection 19. The inner conductor 20 and outer conductor 21 complete an electrical path to a frequency selecting circuit 22. The circuit is selective to the amplified signal energy received thereby, and forwards the amplified signal energy to an output terminal 23.

A rod 24 constructed of insulating material such as glass or Bakelite is mounted within the housing 10. The rod 24 is shown as being supported at both ends thereof within the housing 10 by rings 25 and 26 of insulating material such as Teflon. Other arrangements for supporting the rod 24 may be used. A conductor in the form of a copper or silver-plated tungsten wire, for example, is wound about the rod 24 to produce a helix or helical transmission line 27. One end of the helix 27 is connected to the inner conductor 12 of the coaxial signal input, and the other end of the helix 27 is connected to the inner conductor 20 of the coaxial signal output.

As shown in FIGS. 1 and 2, three semiconductor junction diode strips 28 are positioned along the helix 27 so that the turns of the helix 27 are each loaded by one of the diodes per strip. Each diode is electrically and individually coupled to a turn of the line, there being a plurality of diodes coupled to a given turn of the line. To avoid unnecessary confusion in the drawing, the third strip 28 is not shown in FIG. 1, but is shown in FIG. 2. The diode strips 28 are spaced about the helix 27 to permit each diode on a turn of the helix 27 to see a portion of the signal energy or wavelength different from that seen by the preceding diode at the same time. The three strips 28 are shown as being spaced equi-distant about the helix 27.

A more detailed view of the construction of the semiconductor diode strips 28 is shown in FIG. 3. The strips 28 each include a backing strip 29 constructed of a metallic material to provide mechanical strength. Such materials as quartz may also be used for the backing strip 29. A strip 30 of semi-conductor material having one type of conductivity such as n-type germanium is affixed to the backing strip 29. Dots 31 of a material such as indium are fused at equal intervals along the germanium strip 30 to form an opposite conductivity type or p-type region with the germanium. The diode strips 28 include in this manner distributed variable capacitance p-n junction diodes. Reference to the proper doping and construction techniques used to produce the diodes may be found in the art. The spacing of the dots 31 along the germanium strip 30 is dependent upon the spacing between the turns of the helix 27 to permit the proper mounting of the diode strips 28 on the helix 27.

In mounting the diode strips 28 on the helix 27, the dots 31 may be directly or indirectly connected to the turns. In the case of a direct connection, the dots 31 may be soldered to the turns at the points of contact or the diode strips 28 may be laid on the helix so that the dots 31 merely contact the turns. An indirect connection can be completed by placing a thin insulating layer between the dots 31 and the turns, providing a capacitive coupling therebetween. An indirect or unsoldered coupling of the dots 31 to the turns of the helix 27 has the advantage that the diode strips 28 can be more easily removed and replaced or adjusted in position as desired. In order to maintain the diode strips 28 in the desired positions about the helix 27, bands of insulating material such as ceramic capable of exerting holding pressure may be placed around the diode strips 28 and helix 27. Two such bands 32 and 33 are shown. Clamping rings of a suitable type may be used. In addition to, or instead of, the above holding structure, bracing structure between the diode strips 28 and the rod 24 or the housing 10 may be provided. The construction of such bracing structure is known.

A coupling helix 34 in the form of a copper or other current conducting wire encircles the helix 27 and the diode strips 28 at the input end of the helix 27. One end of the coupling helix 34 is connected to the inner conductor 16 of the coaxial pump input. The coupling helix 34 is wound in the opposite direction to the helix 27, and has sufficient turns spaced so as to provide a proper transfer of energy to the helix 27. While the diameter of the coupling helix 34 can be determined according to the application of the amplifier, the ratio of the diameter of the coupling helix 34 to the diameter of the helix 27 should as a general rule not exceed two-to-one. Ferrite rings made of nickel-iron oxide, for example, are mounted so as to encircle the diode strips 28 and helix 27 to provide unidirectional microwave transmission. The rings 35 function to absorb reflection of energy along the helix 27. The rings 35 are not necessary to the operation of the invention, and may be removed. The actual number of rings 35 used, as well as the positioning thereof along the helix 27, is determined according to the operating frequency and overall level of amplification. The need for the rings 35 and the physical positioning thereof can be determined by simple trial and error procedures.

The common ground connections for the structure shown in FIG. 1 and the other figures of the drawing have been omitted for reasons of convenience. Such connections are provided in a manner understood in the art.

In considering the gain mechanism of the amplifier shown in FIGS. 1 and 2, signal energy at a frequency $F_S$, which is to be amplified, is applied from the source 14 to the helix 27 via the coaxial signal input. Pump energy at a frequency $F_P$ is inductively coupled to the helix 27 from the source 18 via the coaxial pump input and the coupling helix 34. The pump and signal energy move along the helix 27. A radial radio frequency field indicated by the arrow E (FIG. 1) is produced at the respective turns along the helix 27. Since the diodes of the diode strip 28 are transverse to the axis of the helix 27, the diodes are each positioned to be current responsive to the radial field applied thereto. The radial field is determined according to the pump and signal energy. A nonlinear interaction of the pump and signal energy takes place across the diodes. An idler frequency, which is the pump frequency minus the signal frequency ($F_P - F_S$), is generated and a negative conductance is produced. The signal, pump and idler frequency waves move along the helix 27 past the diodes of the diode strips 28 on the turns of the helix 27 with the same velocity. Each diode will see, as a function of time, the same relationship between the frequencies. The presence of the negative conductance per unit length results in energy being added to the signal frequency wave at each turn or section of the helix 27. By way of example, a signal frequency $F_S$ of 3000 megacycles and a pump frequency $F_P$ of 6800 megacycles are used. An idler frequency of 3800 megacycles results. The variable capacitance presented by each diode is driven at the sum of the signal and idler frequencies, resulting in energy being added to the signal frequency wave by the pump. As the signal frequency wave travels from diode to diode down the helix 27, it will assume an increased amplitude, having a gain factor that depends on the characteristics of the diodes, the characteristics of the helix 27, and other characteristics. An amplified signal frequency $F_S$ is available at the output end of the helix 27. The circuit 22 is selective to the amplified signal energy. The amplified signal energy is available at the output terminal 23 for application to a utilization circuit.

The pitch angle of the helix 27 is defined as the arc-tangent of the ratio of the spacing between adjacent turns of the helix 27 to the circumferential length of one turn. Since the circumferential length of one turn depends upon the diameter of the helix 27, the pitch angle is related to the diameter. In addition to supporting the desired signal frequency of the amplifier, the helix 27 must be sufficiently broadband to pass the pump frequency and idler frequency. Such frequencies as the upper side band, the sum of the pump and signal frequencies, may be in the stop band.

The diameter of the helix 27 is related to the operating frequency of the amplifier so that as the operating frequency becomes higher, the helix 27 is of smaller diameter. The pitch angle becomes smaller for an increase in the broadbandedness of the helix 27. For example, to increase the broadbandedness, the diameter of the helix 27 may be increased or the spacing between turns decreased and so on. The diameter of the helix 27 and the spacing between the turns are interrelated. In a particular application, the diameter and the spacing between turns are determined to provide a pitch angle for the helix 27 which will permit operation at the desired operating frequency of the amplifier and will, at the same time, provide the necessary broadbandedness. The mathematics involved in the determination of the pitch angle can be found in the published art on helical structures.

The spacing of the diodes via the diode strips 28 around the turns of the helix 27 should be as small as possible. Preferably, the diodes should be spaced not more than one-eighth of a wavelength at the operating frequency to present as smooth and continuous a line as is possible.

Having determined the pitch angle, the length of the helix 27 is determined on the basis of the level of amplification desired. The longer the helix 27, the more diodes may be mounted via the diode strips 28 on the helix 27. For each additional diode, a further non-linear interaction of the pump, signal and idler frequencies occurs, resulting in a corresponding increase in the amplification of the signal energy. The more diodes that are used, the greater is the net total power gain of the amplifier. As the number of diodes used is increased, the diode strips 28 may be constructed so that the characteristic gain of each diode is reduced. As the gain per diode is reduced, the bandwidth of the amplifier increases. For a given level of total net power gain for the amplifier, the number of diodes required can be determined on the basis of a small gain per diode in order to provide the desired bandwith.

In certain embodiments, it may be desirable to have the signal frequency $F_S$ on-half the pump frequency $F_P$. In this case the idler frequency equals the signal frequency. To obtain amplification, the pump and signal frequencies must be applied to the helix 27 in proper phase relationship which can readily be determined experimentally. The presence of the negative conductance per unit length presented by the diodes of the diode strips 28 results in additional electrical energy being stored in the diode, the additional energy manifesting itself as an increase in voltage across the diode. A corresponding increase in the signal frequency amplitude per section or diode of the amplifier occurs. Since the pump and signal frequencies move along the helix 27 of the amplifier with the same velocity, each diode will see the same phase relationship of pump and signal that every previous diode saw. An amplified signal frequency wave is available at the output terminal 23 for application to a utilization circuit.

While three semiconductor diode strips 28 are shown, the invention is not limited thereto. Less than or more than three diode strips may be used, so long as the diodes are distributed around the turns so that each diode sees a portion of the signal energy different from that seen by the preceding diode. The diodes should be preferably spaced equi-distant around the turns in order to avoid the amplification of frequency modes other than those desired. Further, it is not necessary that the diode strips 28 provide a diode connection for each turn of the helix 27. The number of diode connections is determined according to the level of amplification desired, the characteristics of the diodes, and so on. By determining the pitch angle of the helix 27, the length of the helix 27, and the number and spacing of the diodes of the diode strips 28, an amplifier having the necessary broadbandedness and the desired level of amplification at the operating frequency is provided.

Any suitable structure for supporting the helix 27 may be used in place of the rod 24. In FIG. 4, a core member 36 is shown having three arms. The member 36 may be made of glass or other insulating material. The helix is wound on the arms of the member 36 with the diode strips 28 positioned about the helix 27 in the manner shown in FIGS. 1 and 2.

For the purpose of clarity of drawing, the size of the dots 31 and diode strips 28 with respect to that of the helix 27 has been shown exaggerated. In practice, the size of the diodes including the dots 31 and strip 30 should be small compared to the geometry of the helix 27 in order to reduce to a minimum the disturbance on the helix 27.

Figures 5, 6, 7:
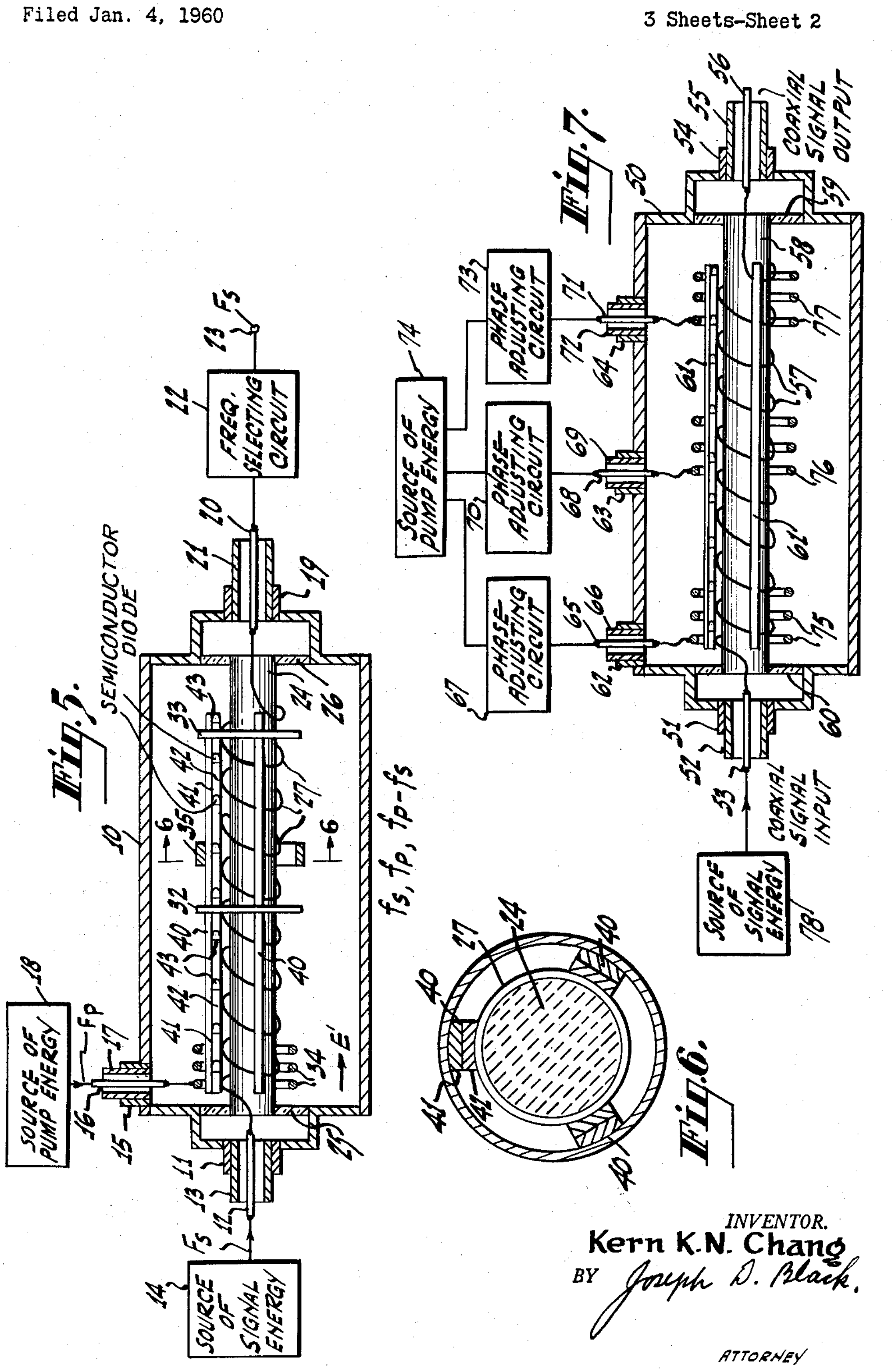
FIG. 5 is a schematic diagram of a further embodiment of a traveling wave parametric amplifier constructed according to the invention.
FIG. 6 is an enlarged cross-sectional view of the helix and semiconductor diode strips shown in FIG. 5.
FIG. 7 is a schematic diagram of a further embodiment of a traveling wave parametric amplifier constructed according to the invention and in which a plurality of pump energy inputs to the amplifier are provided.

An embodiment of the invention in which the direction of the diodes is made longitudinal to the helix axis is shown in FIGS. 5 and 6. The amplifier is the same both in operation and in structure as that shown in FIGS. 1 and 2, except that the diodes of the diode strips of FIGS. 5 and 6 are positioned to respond to the axial radio frequency field of the helix 27. The corresponding components in FIGS. 1 and 5 are given the same reference numerals.

The semiconductor diode strips 40 used in the embodiment of FIGS. 5 and 6 comprise a backing strip 41. The backing strip 41 is preferably constructed of insulating material such as ceramic so as not to electrically short out the diodes mounted thereon. Non-linear, variable capacitance p-n junction diodes are arranged along the backing strip 41. The diodes each comprise a main body 42 of semiconductor material of one type of conductivity such as n-type germanium and a dot 43 of material to form a region of the opposite or p-type of conductivity with the germanium. The dot 43 may be indium. The diode strips 40 are mounted on the helix 27 in the same manner as are the diode strips 28 shown in FIG. 1. The body 42 of each diode is either soldered onto or placed in electrical contact with a turn of the helix 27. Three diode strips 40 are shown in FIGS. 5 and 6, spaced equi-distant about the helix 27.

In operation, the signal energy at frequency $F_S$ supplied to the helix 27 via source 14 and the coaxial signal input and the pump energy at frequency $F_P$ supplied to the helix 27 via source 18, coupling 34 and the coaxial pump input travel down the helix 27 at the same velocity. An axial radio frequency field is produced along the axis of the helix as indicated by the arrow E′ (FIG. 5). The axial radio frequency field is produced by the flow of energy down the length of the helix 27, as contrasted to the radial radio frequency field which is produced by the flow of energy along the turns of the helix 27. The diodes of the diode strips 40 are in a direction longitudinal to the helix axis, and are disposed to respond to the axial radio frequency field of the helix 27. A voltage is applied to the diodes which varies as a function of the pump and signal frequencies. A non-linear interaction of the pump and signal energy takes place across each diode of the diode strips 40, and the idler frequency ($F_P - F_S$) is generated.

As the signal, pump and idler frequency waves move along the helix 27, each diode of the strips 40 will see, as a function of time, the same relationship between the frequencies. The non-linear, variable capacitance presented by each diode causes energy to be added to the signal wave by the pump. As the signal frequency wave travels from diode to diode of the diode strips 40 down the helix 27, it will assume an increased amplitude, having a gain factor that depends on the characteristics of the helix 27, the characteristics of the diodes, and so on. The amplified signal energy is made available at the output terminal 23.

The remarks concerning the pitch angle of the helix 27, the length of the helix 27, the number and spacing of the diodes on the turns of the helix, and so on, made in connection with the embodiment shown in FIG. 1 apply equally well to the embodiment of FIG. 5. The only difference between the two embodiments is that in one case, FIG. 1, the diodes respond to the radial radio frequency field of the helix 27, while in the other case, FIG. 5, the diodes respond to the axial radio frequency field of the helix 27. While three diode strips 40 each having a diode per turn of the helix 27 are shown in FIGS. 5 and 6, the number of diodes distributed along the helix 27 can be determined according to the particular application. Less than or more three diode strips can be used, the number of diodes and the spacing thereof being determined in order to provide the desired level of amplification at the operating frequency of the amplifier.

Because a helical transmission line is a slow wave structure due to the increased number of wavelengths occurring in a given length of the line as compared to a straight line of the same length, an amplifier may be provided according to the invention which can be made broadband. An amplifier constructed according to the embodiment given in FIG. 1 or FIG. 5 can be made to have a wide frequency bandwidth. Problems of radiation encountered in the faster wave devices are eliminated. At the same time, the amplifier can be constructed to have an operating frequency up to and including microwave frequencies.

The signal energy is applied to the amplifier via a coaxial signal input, while the pump energy is applied to the amplifier via a coaxial pump input. Since separate input paths are provided for the pump and signal energy and since the pump energy is unidirectionally coupled to the main helix through the coupled helix, the loss of energy to the respective sources of pump and signal energy is reduced to a minimum. The loss of pump energy to the signal source and the loss of signal energy to the pump source are considerably reduced as compared to the case where the pump and signal energy are applied to an amplifier over the same connection or input path.

The use of a helical transmission line readily permits the adaptability of a non-reciprocal device to the line to provide a unidirectional four-terminal amplifier. The use of the ferrite rings 35 as non-reciprocal devices with the helix provides high gain and unidirectional amplification.

In a traveling wave parametric amplifier constructed according to the embodiment shown in FIG. 5 and designed for S-band operation, the helix 27 was constructed of silver-plated tungsten wire 20 mils in diameter. The helix 27 was six inches long and had a mean diameter of 0.276 inch. The helix 27 had approximately 13 turns per inch. The coupling helix 34 was constructed of the same wire as the helix 27 and had four turns spaced on the basis of nine turns per inch. Two variable capacitance p-n junction diodes having a body of germanium alloyed-diffused were distributed along the length of the helix 27 in a direction longitudinal to the helix axis and were responsive to the axial radio frequency field of the helix. The diodes were small compared to the geometry of the helix 27. The diodes had the following characteristics:

| | | |
|---|---|---|
| Capacitance (−1 volt) | μμf | 0.2–1 |
| Series resistance | ohms | 2–15 |
| Cutoff frequency (nominal) | kmc | 20–100 |

The diodes were assembled in ceramic cylinders about 0.1 inch in diameter, of axial dimension quite close to that of the interturn spacing of the helix.

The signal frequency $F_S$ was 2800 megacycles, the pump frequency $F_P$ was 3800 megacycles, and the idler frequency was 1000 megacycles. The pump power was 60 mw. The amplifier exhibited a 26 db net power gain, and had a voltage gain-bandwidth of 30 megacycles. The relatively small bandwidth was presumably due to the small number of diodes used.

As the pump and signal energy travel down a traveling wave parametric amplifier and appear across the diodes distributed along the amplifier, amplification occurs by the transfer of pump energy to the signal. The amplitude of the pump energy when applied to the input end of the amplifier decreases as the pump and signal energy travel along the amplifier. This means that normally the diodes at the output end of the amplifier see a pump energy of smaller amplitude than do the diodes at the input end. In this condition, the diodes at the output end will produce less gain per diode than do the diodes at the input end. For the most efficient operation of the amplifier, it is desirable that substantially the same gain per diode be obtained over the length of the amplifier. To achieve this result, the amplitude of the pump energy should be maintained substantially constant over the entire length of the amplifier. This involves the simultaneous application of pump energy at separated points along the amplifier. Cavities and other complex structure have previously been required to accomplish this result. The arrangement of the invention permits this result to be achieved by the use of simple structure.

A traveling wave parametric amplifier having a plurality of pump energy inputs, and otherwise constructed according to the embodiment of the invention shown in FIG. 5, is shown in FIG. 7. A metallic housing 50 made of brass or other suitable material is provided. The housing 50 may be generally rectangular, cylindrical or any other shape. A coaxial signal input is provided at one end of the housing 50. The coaxial signal input includes a coaxial connection 51 and a coaxial cable having an inner conductor 53 and an outer conductor 52. A coaxial signal output is provided at the other end of the housing. The coaxial signal output includes a coaxial connection 54 and a coaxial cable having an inner conductor 56 and an outer conductor 55.

A helical transmission line 57 is supported by a rod or similar structure 58 constructed of insulating material having mechanical strength. One end of the helix 57 is connected to the inner conductor 53 and the other end of the helix 57 is connected to the inner conductor 56. The rod 58 is supported within the housing 50 by rings 59, 60 of insulating material or any other suitable structure. Strips 61 of semiconductor junction diodes exhibiting non-linear, variable capacitance with applied voltage are positioned about the helix 57. The diode strips 61 include a backing strip for mechanical strength and are otherwise similar to the diode strips 40 shown in FIG. 5. The diode strips 61 are positioned so that each turn of the helix 57 is in electrical contact with a single diode per strip. The diodes are all mounted in a direction longitudinal to the helix axis, and are positioned to respond to the axial radio frequency field of the helix 57. While only two diode strips 61 are visible in the view of FIG. 7, a third diode strip 61 is positioned on the side unseen in FIG. 7 in the position indicated in FIG. 6.

Three coaxial connections 62, 63 and 64 are spaced along the side area of the housing 50. A coaxial cable having an inner conductor 65 and an outer conductor 66 is connected between the connection 62 and a phase adjusting circuit 67. A second coaxial cable having an inner conductor 68 and an outer conductor 69 is connected between the connection 63 and a phase adjusting circuit 70. An electrical connection is completed between a further phase adjusting circuit 73 and the connection 64 by a coaxial cable having an inner conductor 71 and an outer conductor 72. Three coupling helices 75, 76 and 77 are arranged in an inductive coupling relationship with the helix 57. The coupling helix 75 is connected to the inner conductor 65, the coupling helix 76 is connected to the inner conductor 68, and the coupling helix 77 is connected to the inner conductor 71. A source of pump energy 74 is connected to the phase adjusting circuits 67, 70 and 73.

Signal energy is applied from the source 78 to the helix 57 via the coaxial signal input. Pump energy is applied to the helix 57 via the phase adjusting circuits 67, 70, 73 and the coupling helices 75, 76, 77. The phase adjusting circuits 67, 70 and 73 function to adjust the phase of the pump energy passed thereby so that the phase of the pump energy traveling down the helix 57 remains unaltered. In this manner, any reduction in the amplitude of the pump energy is restored without altering the phase of the pump energy. The phase adjusting circuits 67, 70, 73 and the coupling helices 75, 76, 77 can be arranged to provide a substantially constant amplitude pump energy along the helix 57. Amplification of the signal energy takes place in the manner described in connection with FIG. 5. The inner conductor 56 and outer conductor 55 can be connected to a frequency selective circuit 22 in the manner shown in FIGURES 1 and 5, the amplified signal energy being made available for application to a utilization circuit. A relatively simple arrangement for applying pump energy over a plurality of paths to the amplifier is possible by using the helix.

While only three pump inputs are shown, any number may be used. The number and spacing of the pump inputs along the amplifier can be determined in a given application to achieve the best results. The number and spacing of the pump inputs, as well as the pump power per input, is a function of the rate of decay of the pump energy. In practice, the pump inputs may be spaced one to five wavelengths apart along the helix 57. While the plural pump input arrangement of FIG. 7 has been described with an amplifier using diodes mounted in the axial radio frequency field of the helix, the exact same structure permitting plural pump inputs can be used with the diodes mounted in the radial frequency field of the helix.

Figures 8, 9:
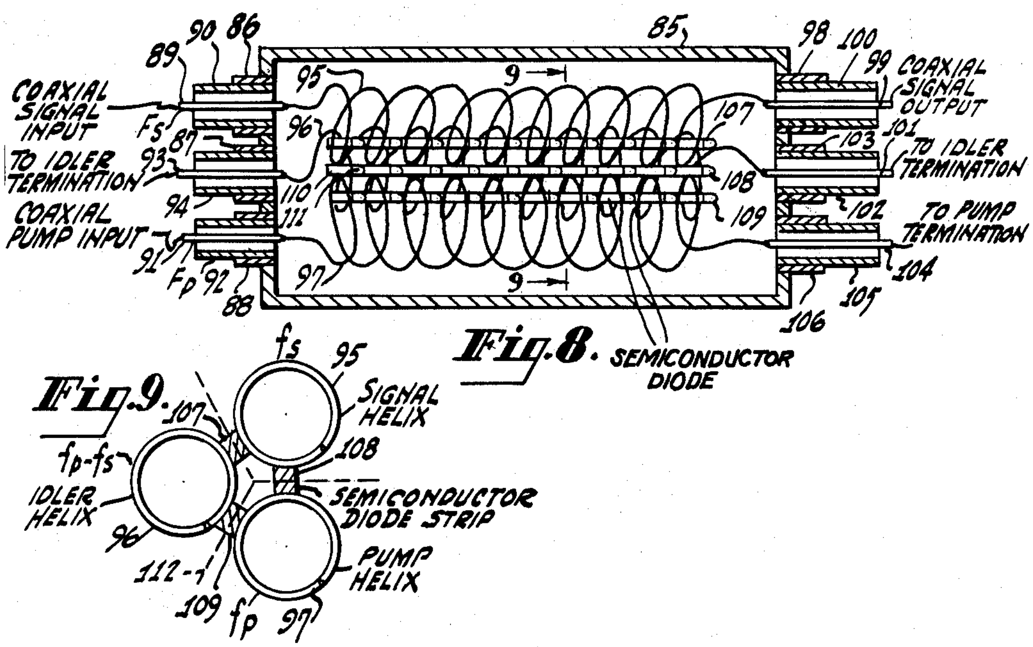
FIG. 8 is a schematic diagram of a further embodiment of a traveling wave parametric amplifier constructed according to the invention and including three helical transmission lines in association with three semiconductor diode strips.
FIG. 9 is an enlarged cross-sectional view of the helices and the semiconductor diode strips shown in FIG. 8.

In constructing an amplifier according to the embodiments of FIGS. 1 and 5 for a particular application, the helix to be used may not be as non-dispersive as desired over the frequency range of operation. That is, the helix may not exhibit as uniform a velocity of wavelengths over the desired frequency range of the amplifier as desired. In this case, the embodiment of the invention shown in FIG. 8 may be used. FIG. 9 is a cross-sectional view of the helices and diode strips shown in FIG. 8.

A housing 85 is provided made of brass or other suitable metallic material. Three standard coaxial connections 86, 87 and 88 are located at the input end of the housing. A coaxial signal input including an inner conductor 89 and an outer conductor 90 is connected to the housing 85 via the connection 86. A coaxial pump input including an inner conductor 91 and an outer conductor 92 is connected to the housing 85 via the connection 88. A coaxial cable including an inner conductor 93 and an outer conductor 94 is connected between the connection 87 and a non-reflective termination.

A first helix 95 has one end connected to the inner conductor 89 of the coaxial signal input and the other end is connected to the inner conductor 99 of a coaxial signal output also including a coaxial connection 98 and an outer conductor 100. A second helix 96 has one end connected to the inner conductor 93 and the other end connected to the inner conductor 101 of a coaxial cable. The inner conductor 101 is associated with an outer conductor 102 and coaxial connection 103 on the housing 85. A third helix 97 is connected between the inner conductor 91 of the coaxial pump input and the inner conductor 104 of a coaxial cable. The inner conductor 104 is associated with an outer conductor 105 and a coaxial connection 106.

The helices 95, 96 and 97 are all wound in the same direction. They may be wound on core devices constructed of Bakelite or other material for mechanical strength, the cores being suitably supported within the housing 85. Other forms of supporting structure for the helices may be used. The helices 95, 96, 97 are substantially tangent to one another but separated by the semiconductor diode strips 107, 108 and 109. The diode strips 107, 108, 109 each include p-n non-linear, variable capacitance junction diodes. Each diode on one of the strips comprises a body 110 of semiconductor material such as n-type material and an indium dot 111 to form an opposite conductivity type or p-type region with the germanium. The diode strips 107, 108 and 109 may each include a backing strip or other structure for imparting mechanical strength thereto. In using a backing strip, care must be taken when connecting the diodes to the turns of the helices so as not to produce a continuous short circuit along the row of diodes.

The helices 95 and 96 are separated by the diodes of the diode strip 107, the helices 96 and 97 are separated by the diodes of the diode strip 109, and the helices 95 and 97 are separated by the diodes of the diode strip 108. The diode strips 107, 108 and 109 may be constructed with respect to the spacing between turns of the helices 95, 96 and 97 so that a turn of any one of the helices may engage at least one diode per diode strip in contact therewith. The diodes of the diode strips 107, 108, 109 may be in direct or indirect contact with the turns of the helices 95, 96 and 97. Clamping bands or similar structure surrounding the helices 95, 96, 97 may be provided to hold the helices 95, 96, 97 and the diode strips 107, 108, 109 in their proper relative positions. As a matter of convenience, the diodes of the diode strips 107, 108, 109 are shown as having their main area 110 in contact with the respective turns of the helices 95, 96, 97. The diodes of the diode strips 107, 108, 109 are in a direction longitudinal to the axis of the helices with which they are associated, and are responsive to the axial radio frequency field of the helices.

In constructing the amplifier, the diameter and pitch angle of the helix 95 are determined so that the helix 95 will support the signal frequency but will not support the pump and idler frequencies. The diameter and pitch angle of the helix 97 are determined so that the helix 97 will support the pump frequency but will not support the signal and idler frequencies. In a similar manner, the diameter and pitch angle of the helix 96 are determined so that the helix 96 will support the idler frequency but will not support the pump and signal frequencies. The helices are constructed so that energy will travel down all three helices with the same phase velocity. Mathematical procedures are known for relating the diameter and pitch angle for one helix to the diameter and pitch angle of the other helices to provide this condition.

The signal energy to be amplified is applied to the helix 95 via the coaxial signal input, and the pump energy is applied to the helix 97 via the coaxial pump input. As the signal energy and pump energy travel down the respective helices 95 and 97 with the same velocity, a non-linear interaction of the pump and signal energy takes place across the diodes of the diode strip 108. The idler frequency is generated. Because of the close physical positioning of the diode strips 107, 108 and 109, the energy at the idler frequency generated across the diode strip 108, as well as the pump and signal energy, appear across the diode strips 107 and 109. The energy at the idler frequency travels along the helix 96 at the same velocity as does the energy at pump and signal frequencies along the respective helices 97 and 95.

The signal, pump and idler frequency waves move along the respective helices 95, 96, 97 past the diodes of the diode strips 107, 108 and 109. Each diode of the diode strips 107, 108, 109 will see the same non-linear relationship between the frequencies. Assuming that the pump frequency is not twice the signal frequency, the variable capacitance of each diode is driven at the sum of the signal and idler frequencies, resulting in energy being added to the signal frequency wave by the pump. The non-linear interaction of the signal, pump and idler frequencies across the diodes of the diode strips 107, 108, 109 causes the signal energy to increase in amplitude as the signal energy travels along the helix 95. The amplifier will have a power gain factor that depends on the characteristics of the diodes of the diode strips 107, 108, 109, the number of diodes distributed along the helices 95, 96 and 97, the characteristics of the helices 95, 96 and 97, and other characteristics.

The amplified signal energy is taken at the output end of the helix 95 via the coaxial signal output for application to a utilization circuit. The pump helix 97 is terminated via the inner conductor 104 and outer conductor 105 in a non-reflective load such that the pump energy is not reflected back along the helix 97. In a similar manner, the output end of the idler helix 96 is terminated via the inner conductor 101 and outer conductor 102 in a non-reflective load. The idler helix 96 is therefore terminated at both ends. Many examples of non-reflective resistive load devices suitable for terminating the idler helix 96, and pump helix 97 are available. Since each of the helices 95, 96 and 97 are non-dispersive, the amplifier including the three helices is non-dispersive over the range of operating frequencies. In order to insure that interaction of the pump, signal and idler frequencies is concentrated across the diodes of the diode strips 107, 108 and 109, a shield 112 constructed of a wire mesh or screen, for example, may be positioned between the helices 95, 96 and 97, as shown in FIGURE 8. The shield 112 is not, however, essential to the operation of the amplifier.

While the diodes of the diode strips 107, 108 and 109 are shown in FIGURE 8 having their current conducting axes longitudinal to the axes of the helices 95, 96 and 97, the current conducting axes of the diodes may be transverse to the axes of the helices in the manner shown in FIGURE 2, with the diodes responding to the radial radio frequency fields of the helices.

In certain applications, the pump and signal frequencies may be so related that the idler frequency equals or is close to the signal frequency. The third or idler helix 96 is eliminated, since the signal helix 95 supports both the idler and signal frequencies. The amplifier will comprise only the signal helix 95 separated from the pump helix 97 by the diode strip 108.

Figure 10:
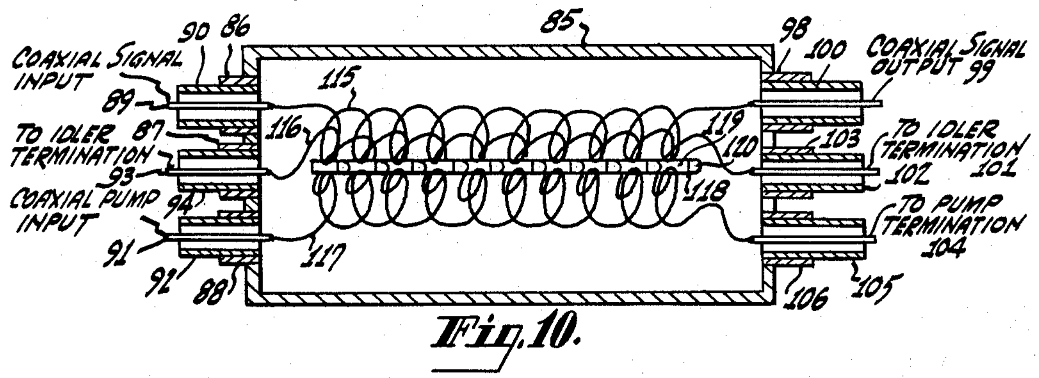
FIG. 10 is a schematic diagram of a further embodiment of a traveling wave parametric amplifier constructed according to the invention and including three helical transmission lines in association with a single semiconduction diode strip.
Figure 11:
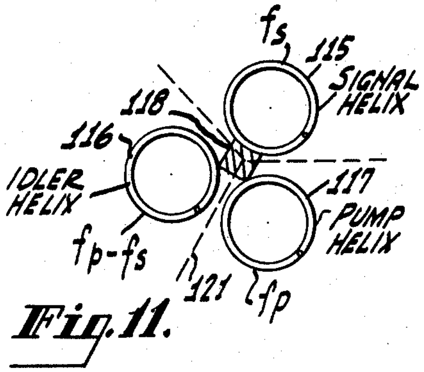
FIG. 11 is an enlarged transverse cross-sectional view of the helices and the semi-conductor diode strip shown in FIG. 10.

Instead of using three semiconductor diode strips in association with the idler, pump and signal helices, an amplifier may be constructed according to the embodiment of the invention shown in FIGURES 10 and 11 and including a single diode strip associated with the three helices. The housing, as well as the coaxial connections are identical to the corresponding elements shown in the embodiment of FIGURE 8. The elements common to FIGURES 8 and 10 have been given the same reference numerals.

A signal helix 115 is connected between the inner conductor 89 of the coaxial signal input and the inner conductor 99 of the coaxial signal output. A pump helix 116 is connected between the inner conductor 91 of the coaxial pump input and the inner conductor 104 of the coaxial cable terminated in a non-reflective load. The idler helix 117 is terminated at both ends by a non-reflective load via the coaxial cables including inner conductors 93 and 101.

A single semiconductor p-n junction diode strip 118 is positioned so that the turns of all three helices 115, 116 and 117 either indirectly or directly contact the diodes of the diode strip 118. The diodes are of the type exhibiting non-linear, variable capacitance with applied electric field. The corresponding turns of the helices 115, 116 and 117 are loaded by the same diodes. The diodes of the diode strip each include a main area or body 119 of material having one type of conductivity and a dot 120 to form an opposite type of conductivity region with the main area. The body 119 may be made of germanium and the dot 120 of indium, for example. The helices 115, 116 and 117 can be wound on suitable core devices supported within the housing 85. Clamping bands or other structure may be used to hold the helices 115, 116, 117 and the diode strip 118 in their proper relative positions.

Figure 12:
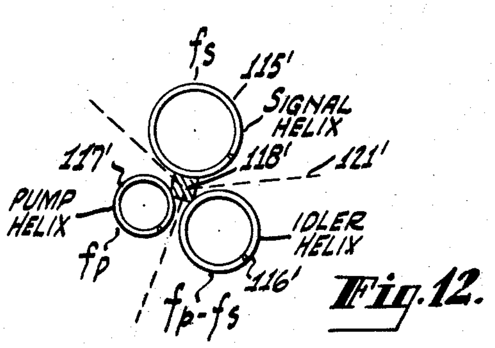
FIG. 12 is a view in transverse cross-section showing a different manner in which the helices and the semiconductor diode strip shown in the embodiment of FIG. 10 may be arranged.

The helix 115 is made to have a diameter and pitch angle such that the helix 115 supports the signal frequency but not the pump and idler frequencies. The helix 116 supports the idler frequency but not the signal and pump frequencies, and the helix 117 supports the pump frequency but not the signal and idler frequencies. The three helices 115, 116 and 117 are constructed to carry the energy applied thereto with the same phase velocity. As indicated in FIGURE 11, the helices 115, 116 and 117 may have the same diameter. The pitch angles of the helices 115, 116, 117 may be made different in order to meet the above operating conditions. As shown in FIGURE 12, the helices 115′, 116′ and 117′ may be of different diameters. Since the signal frequency is the lowest frequency, the signal helix 115′ is of the largest diameter. The pump frequency is the highest frequency, causing the pump helix 117′ to be of the smallest diameter. The idler helix 116′ has a diameter intermediate the diameter of the pump helix 117′ and the diameter of the signal helix 115′. Where the diameters of the helices 115, 116 and 117 are different as shown in FIGURE 12, the pitch angles of the three helices may be the same. In practice, each helix may differ from the other two helices both in diameter and pitch angle. The helices 115, 116, 117 are constructed according to known matematical procedures. The particular geometry of the helices 115, 116, 117 is determined according to the operating frequencies, the desired bandwidth of the amplifier and so on.

The diodes of the diode strip 118 are in a direction longitudinal to the axes of the helices 115, 116 and 117, and respond to the axial radio frequency field of the helices. As the signal, pump and idler frequencies move down the respective helices 115, 117 and 116 past the diodes of the diode strip 118, a non-linear interaction between the three frequencies takes place across the diodes. Energy is transferred from the pump to the signal, and the signal energy is increased in amplitude as it moves along the helix 115. The amplified signal energy is available at the coaxial signal output for application to a utilization circuit. The next power gain of the amplifier depends on the gain characteristics of the diodes forming the diode strip 118, the number of diodes distributed along the helices 115, 116, 117, the characteristics of the helices 115, 116, 117 and other factors. As in the embodiment shown in FIGURE 8, a shield 121 constructed of a wire mesh or screen may be positioned between the helices 115, 116 and 117 such that the interaction of pump, signal and idler frequencies occurs primarily across the diodes of the diode strip 118.

Reference has been made to the use of germanium p-n junction diodes in the construction of the diode strips used in the various embodiments of the invention. In practice, the nonlinear, variable capacitance may be any known structure suitable for this purpose. For example, a germanium diode with extremely high doping concentration and having the tunneling effect which results in negative resistance may be used.

What is claimed is:

1. A parametric amplifier comprising, in combination, a continuously wound helical transmission line, a single variable capacitance semiconductor junction diode coupled for radio frequency current conduction between a point on one turn of said line and a point on the next turn of said line in response to a radio frequency field of said line, means connected to one end of said line for applying a first radio frequency signal of signal frequency to said one end of said line, means including a helix in an inductive energy coupling relationship with said one end of said line for applying a second radio frequency signal of pump frequency higher than said signal frequency to said line, said line being dimensioned to support electrical energy of said pump frequency, said signal frequency, and a frequency equal to the difference between said pump and signal frequencies, and means to derive from the other end of said line an output signal having a frequency equal to one of said signal, pump and difference frequencies.

2. A traveling wave parametric amplifier comprising, in combination, a continuously wound helical transmission line, a single variable capacitance semiconductor junction diode coupled for radio frequency current conduction between a point on a first turn of said line and a point on a second turn of said line in response to a radio frequency field of said line, a second, single variable capacitance semiconductor junction diode coupled for radio frequency current conduction between a point on a turn of said line and a point on another turn of said line other than said first and second turns in response to a radio frequency field of said line, means to apply a first radio frequency signal of signal frequency to one end of said line, means to apply a second radio frequency signal of pump frequency higher than said signal frequency to said line, said line being dimensioned to support electrical energy of said pump frequency, said signal frequency, and a frequency equal to the difference between said pump and signal frequencies, and means to derive from the other end of said line an output signal of a frequency equal to one of said signal and difference frequencies.

3. A traveling wave parametric amplifier comprising, in combination, a continuously wound helical transmission line, a single variable capacitance semiconductor junction diode coupled for radio frequency current conduction in a direction parallel to the longitudinal axis of said line between a point on a first turn of said line and a point on a second turn of said line in response to the axial radio frequency field of said line, a second, single variable capacitance semiconductor junction diode coupled for radio frequency current conduction in a direction parallel to the longitudinal axis of said line between a point on a turn of said line and a point on another turn of said line other than said first and second turns in response to the axial radio frequency field of said line, the spacing along said line between the points on the turns to which said first diode is connected being equal to the spacing between the points on the turns to which said second diode is connected, means to apply a first radio frequency signal of signal frequency to one end of said line, means to apply a second radio frequency signal of pump frequency higher than said signal frequency to said line, said line being dimensioned to support electrical energy of said pump frequency, said signal frequency, and a frequency equal to the difference between said pump and signal frequencies, and means to derive from the other end of said line an output signal of a frequency equal to one of said signal and difference frequencies.

4. A traveling wave parametric amplifier comprising, in combination, a continuously wound helical transmission line, a single variable capacitance semiconductor junction diode connected for radio frequency current conduction between a point on a first turn of said line and a point on a second turn of said line next to said first turn in response to a radio frequency field of said line, a second, single variable capacitance semiconductor junction diode connected for radio frequency current conduction between a point on a third turn of said line and a point on a fourth turn of said line next to said third turn in response to a radio frequency field of said line, the spacing along said line between the points on said first and second turns to which said first diode is connected being substantially equal to the spacing along said line between the points on said third and fourth turns to which said second diode is connected.

means to apply a first radio frequency signal of signal frequency to one end of said line, means to apply a second radio frequency signal of pump frequency higher than said signal frequency of said line, said line being dimensioned to support electrical energy of said pump frequency, said signal frequency, and a frequency equal to the difference between said pump and signal frequencies, and means to derive from the other end of said line an output signal of a frequency equal to one of said signal and difference frequencies.

5. A traveling wave parametric amplifier comprising, in combination, a continuously wound helical transmission line, a plurality of variable capacitance semiconductor junction diodes distributed along said line with each diode individually and singly coupled for radio frequency current conduction between a point on one turn of said line and a point on a second turn of said line in response to a radio frequency field of said line, said diodes being individually coupled across different portions along said line with the length of all of said portions across which a diode is coupled being substantially equal, means to apply a first radio frequency signal of signal frequency to one end of said line, means to apply a second radio frequency signal of pump frequency higher than said signal frequency to said line, said line being dimensioned to support electrical energy of said pump frequency, said signal frequency, and a frequency equal to the difference between said pump and signal frequencies, and means to derive from the other end of said line an output signal of a frequency equal to one of said signal and difference frequencies.

6. A traveling wave parametric amplifier as claimed in claim 5 and wherein, said diodes are arranged in a continuous strip positioned parallel to the longitudinal axis of said line with each diode in said strip being directly and individually connected to only one turn of said line.

7. A traveling wave parametric amplifier as claimed in claim 5 and wherein, said diodes are arranged in a plurality of strips positioned parallel to the longitudinal axis of said line and spaced equi-distance about said line, each turn of said line being in electrical contact with a single diode per strip.

8. A traveling wave parametric amplifier comprising, in combination, a continuously wound helical transmission line, a plurality of variable capacitance semiconductor junction diodes distributed along said line with each diode individually and singly connected for radio frequency current conduction in a direction parallel to the longitudinal axis of said line between a point on one turn of said line and a point on a second turn of said line in response to the axial radio frequency field of said line, said diodes being individually connected across different portions along said line with the length of all of said portions across which a diode is connected being substantially equal, means connected to one end of said line for applying a first radio frequency signal of signal frequency to one end of said line, means including a helix in an inductive energy coupling relationship with said one end of said line for applying a second radio frequency signal of pump frequency higher than said signal frequency to said line, said line being dimensioned to support electrical energy of said pump frequency, said signal frequency, and a frequency equal to the difference between said pump and signal frequencies, and means to derive from the other end of said line an output signal of a frequency equal to said frequency.

9. A traveling wave parametric amplifier comprising, in combination, a continuously wound helical transmission line, a plurality of variable capacitance semiconductor junction diodes distributed along said line with each diode individually and singly connected for radio frequency current conduction between a point on one turn of said line and a point on a second turn of said line in response to a radio frequency field of said line, said diodes being individually connected across different portions along said line with the length of all of said portions across which a diode is connected being substantially equal, means to apply a first radio frequency signal of signal frequency to one end of said line, a plurality of helices encircling said line at spaced points along said line with each of said helices being in an inductive energy coupling relationship with said line, a separate phase adjusting circuit individually connected between each of said helices and a source of a second radio frequency signal of pump frequency higher than said signal frequency, said phase adjusting circuits serving to cause the phase of electrical energy of said pump frequency traveling along said line to remain unaltered, said line being dimensioned to support electrical energy of said pump frequency, said signal frequency, and a frequency equal to the difference between said pump and signal frequencies, and means to derive from the other end of said line an output signal of a frequency equal to said signal frequency.

10. A traveling wave parametric amplifier comprising, in combination, a continuously wound helical transmission line, a single variable capacitance semiconductor junction diode connected for radio frequency current conduction in a direction parallel to the longitudinal axis of said line between a point on a first turn of said line and a point on a second turn of said line next to said first turn in response to the axial radio frequency field of said line, a second, single variable capacitance semiconductor junction diode connected for radio frequency current conduction in a direction parallel to the longitudinal axis of said line between a point on a third turn of said line and a point on a fourth turn of said line next to said third turn in response to the axial radio frequency field of said line, the spacing along said line between the points on said first and second turns being substantially equal to the spacing between the points on said third and fourth turns, means connected to one end of said line for applying a first radio frequency signal of signal frequency to said one end of said line, means including a helix in an inductive energy coupling relationship with said one end of said line for applying a second radio frequency signal of pump frequency higher than said signal frequency to said line, said line being dimensioned to support electrical energy of said pump frequency, said signal frequency, and a frequency equal to the difference between said pump and signal frequencies, and means to derive from the other end of said line an output signal of a frequency equal to one of said signal and difference frequencies.

11. A traveling wave parametric amplifier comprising, in combination, first, second and third continuously wound helical transmission lines positioned with their longitudinal axes in parallel, a first plurality of variable capacitance semiconductor junction diodes distributed along said first and second lines with each diode individually and singly connected for radio frequency current conduction between a point on one turn of said first line and a point on another turn of said first line and between a point on one turn of said second line and a point on another turn of said second line in response to a radio frequency field of said first and second lines, a second plurality of variable capacitance semiconductor junction diodes distributed along said second and third lines with each diode individually and singly connected for radio frequency current conduction between a point on one turn of said second line and a point on another turn of said second line and between a point on one turn of said third line and a point on another turn of said third line in response to a radio frequency field of said second and third lines, a third plurality of variable capacitance semiconductor junction diodes distributed along said third and first lines with each diode individually and singly connected for radio frequency current conduction between a point on one turn of said third line and a point on another turn of said third line and between a point on one turn of said first line and a point on another turn of said first line in response to a radio frequency field of said first and third lines, means to apply a radio frequency signal of signal frequency to one end of said first line, means to apply a second radio frequency signal of pump frequency higher than said signal frequency to one end of said second line, means connected to the other end of said second line by which said other end of said second line is terminated, means connected to one end of said third line corresponding in position to said one end of said first line by which said one end of said third line is terminated, said lines being dimensioned so that with respect to said pump and signal frequencies said first line supports electrical energy only of said signal frequency, said second line supports electrical energy only of said pump frequency, and said third line supports electrical energy only of a frequency equal to the difference between said pump and signal frequencies, and means to derive an output signal from the other end of one of said first and third lines and to terminate the other end of the other one of said first and third lines.

12. A traveling wave parametric amplifier comprising, in combination, first, second and third continuously wound helical transmission lines with their longitudinal axes in parallel, a plurality of variable capacitance semiconductor junction diodes distributed along said first, second and third lines with each diode individually and singly connected for radio frequency current conduction between a point on one turn of said first line and a point on another turn of said first line, between a point on one turn of said second line and a point on another turn of said second line, and between a point on one turn of said third line and another point on another turn of said third line in response to a radio frequency field of said first, second and third lines, means to apply a radio frequency signal of signal frequency to one end of said first line, means to apply a second radio frequency signal of pump frequency higher than said signal frequency to one end of said second line, means connected to the other end of said second line by which the other end of said second line is terminated, means connected to one end of said third line corresponding in position to said one end of said first line by which said one end of said third line is terminated, said lines being dimensioned so that with respect to said pump and signal frequencies said first line supports electrical energy only of said signal frequency, said second line supports electrical energy only of said pump frequency, and said third line supports electrical energy only of a frequency equal to the difference between said pump and signal frequencies, and means to derive an output signal from the other end of one of said first and third lines and to terminate the other end of the other one of said first and third lines.

References Cited in the file of this patent

UNITED STATES PATENTS

| | | |
|---|---|---|
| 2,588,831 | Hansell | Mar. 11, 1952 |
| 2,974,252 | Quate | Mar. 7, 1961 |
| 2,976,492 | Seidel | Mar. 21, 1961 |
| 3,008,089 | Uhlir | Nov. 7, 1961 |
| 3,012,203 | Tien | Dec. 5, 1961 |
| 3,016,492 | Landauer | Jan. 9, 1962 |

FOREIGN PATENTS

| | | |
|---|---|---|
| 811,049 | Great Britain | Mar. 25, 1959 |

OTHER REFERENCES

Tien et al.: "Proceedings of the IRE," April 1958, pages 700–706.

Reed: "IRE Transactions on Electron Devices," April 1959, pages 216–224.

Heilmeier: "RCA Review," September 1959, pages 442–454.